(12) United States Patent
Kawano et al.

(10) Patent No.: US 10,490,443 B2
(45) Date of Patent: Nov. 26, 2019

(54) SELECTIVE FILM FORMING METHOD AND METHOD OF MANUFACTURING SEMICONDUCTOR DEVICE

(71) Applicant: TOKYO ELECTRON LIMITED, Tokyo (JP)

(72) Inventors: Yumiko Kawano, Nirasaki (JP); Shuji Azumo, Nirasaki (JP); Hiroki Murakami, Nirasaki (JP); Michitaka Aita, Nirasaki (JP); Tadahiro Ishizaka, Nirasaki (JP); Koji Akiyama, Nirasaki (JP); Yusaku Kashiwagi, Nirasaki (JP); Hajime Nakabayashi, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/144,311

(22) Filed: Sep. 27, 2018

(65) Prior Publication Data

US 2019/0096750 A1 Mar. 28, 2019

(30) Foreign Application Priority Data

Sep. 28, 2017 (JP) ................................. 2017-187575

(51) Int. Cl.
*H01L 21/00* (2006.01)
*H01L 21/768* (2006.01)

(52) U.S. Cl.
CPC .. *H01L 21/76807* (2013.01); *H01L 21/76805* (2013.01); *H01L 21/76846* (2013.01); *H01L 21/76879* (2013.01)

(58) Field of Classification Search
CPC ......... H01L 21/76807; H01L 21/76805; H01L 21/76846; H01L 21/76879
See application file for complete search history.

(56) References Cited

U.S. PATENT DOCUMENTS

| 2004/0146655 A1 | 7/2004 | Seid et al. |
| 2006/0214305 A1* | 9/2006 | Sakata .................. C23C 16/045 |
| | | 257/774 |

(Continued)

FOREIGN PATENT DOCUMENTS

| JP | 200283869 A | 3/2002 |
| JP | 201686145 A | 5/2016 |
| KR | 10-2012-0109902 A | 10/2012 |

OTHER PUBLICATIONS

Kim, W-H. et al. "Atomic layer deposition of ruthenium-oxide thin films by using a Ru(EtCp)2 precursor and oxygen gas", Journal of the Korean Physical Society, vol. 55, No. 1, Jul. 2009, pp. 32-37.

*Primary Examiner* — Richard A Booth
(74) *Attorney, Agent, or Firm* — Nath, Goldberg & Meyer; Jerald L. Meyer (57) ABSTRACT

A method of selectively forming a thin film on a substrate to be processed in which a conductive film and an insulating film are exposed to a surface of the substrate includes: selectively forming a first Ru film only on a first surface, which is an exposed surface of the conductive film and formed of one of Ru, $RuO_2$, Pt, Pd, CuO, and $CuO_2$, using an $Ru(EtCp)_2$ gas and an $O_2$ gas; and selectively forming a first $SiO_2$-containing insulating film only on a second surface, which is an exposed surface of the insulating film has OH groups, by performing one or more times a process of supplying a TMA gas to the substrate to adsorb TMA only to the second surface and a process of forming an $SiO_2$ film only on a surface of the adsorbed TMA using a silanol group-containing silicon raw material and an oxidizing agent.

8 Claims, 8 Drawing Sheets

(56) References Cited

U.S. PATENT DOCUMENTS

| | | | | |
|---|---|---|---|---|
| 2007/0264816 A1* | 11/2007 | Lavoie | .................... | C23C 16/18 438/618 |
| 2014/0377947 A1* | 12/2014 | Ishizaka | .................. | C23C 16/16 438/654 |
| 2015/0299848 A1 | 10/2015 | Haukka et al. | | |

* cited by examiner

SELECTIVE FILM FORMING METHOD AND METHOD OF MANUFACTURING SEMICONDUCTOR DEVICE

CROSS-REFERENCE TO RELATED APPLICATION

This application is based on and claims the benefit of priority from Japanese Patent Application No. 2017-187575, filed on Sep. 28, 2017, the entire contents of which are incorporated herein by reference.

TECHNICAL FIELD

The present disclosure relates to a selective film forming method of selectively forming a thin film and a method of manufacturing a semiconductor device.

BACKGROUND

In a manufacturing process of a semiconductor device, there is used a technique of forming an insulating film after forming a lower layer wiring, forming a dual damascene structure having a trench and a via hole by photolithography and etching, and burying a conductive film of Cu or the like to form a wiring.

However, recently, miniaturization of semiconductor devices is progressing. Thus, according to miniaturization of a photolithography process, in some cases, a problem arises in that misalignment occurs in a connection portion of a contact portion of the damascene structure with the lower layer wiring, which increases a via resistance.

Therefore, there is a demand for a technique of selectively and self-aligningly forming a conductive film and an insulating film on another conductive film constituting a wiring and another insulating film around the conductive film constituting the wiring, respectively.

As an example of such a technique, there is used a selective growth method of selectively growing a thin film on an underlayer to which an insulating film and metal are exposed. The method includes a process of selectively growing a film having a thickness to be reduced by combustion on an underlying metal using the underlying metal as a catalyst, and a process of selectively growing a silicon oxide film on an underlying insulating film while combusting the film having the thickness to be reduced by combustion.

There is also used a method of selectively depositing a first metal material on a first surface of a substrate and a second dielectric material (insulator) on a second surface of the same substrate. The first surface is made of metal or a semiconductor material and the second surface serves as a termination of OH, $NH_x$, or $SH_x$. The method includes selectively depositing the first metal material on the first surface of the substrate with respect to the second surface and selectively depositing the second dielectric material (insulator) on the second surface of the substrate with respect to the first surface.

In the former method, a metal film is selectively grown on another metal film and an insulating film is selectively grown on another insulating film. However, the method does not sufficiently specify how to grow an insulating film without forming the insulating film on a metal film. In the latter method, when a metal film is selectively formed or when an insulating film is selectively formed, it is not always ensured to sufficiently prevent a film from being formed on a portion other than a desired portion.

SUMMARY

Some embodiments of the present disclosure provide a technique capable of forming a conductive film on an exposed surface of another conductive film and forming an insulating film on a surface of another insulating film with sufficient selectivity.

According to one embodiment of the present disclosure, there is provided a selective film forming method of selectively forming a thin film on a substrate to be processed in which a conductive film and an insulating film are exposed to a surface of the substrate. A first surface which is an exposed surface of the conductive film is formed of one of Ru, $RuO_2$, Pt, Pd, CuO, and $CuO_2$, and a second surface which is an exposed surface of the insulating film has OH groups. The method includes: selectively forming a first Ru film having a first film thickness only on the first surface using an $Ru(EtCp)_2$ gas and an $O_2$ gas; and selectively forming a first $SiO_2$-containing insulating film having a second film thickness only on the second surface by performing one or more times a process of supplying a TMA gas to the substrate to adsorb TMA only to the second surface and a process of forming an $SiO_2$ film only on a surface of the adsorbed TMA using a silanol group-containing silicon raw material and an oxidizing agent.

According to one embodiment of the present disclosure, there is provided a method of manufacturing a semiconductor device. The method includes: preparing a substrate to be processed having an interlayer insulating film formed on a surface of the substrate, the interlayer insulating film having a recess of a predetermined pattern formed on a surface of the interlayer insulating film; burying a conductive film formed of one of Ru, $RuO_2$, Pt, Pd, Cu, CuO, and $CuO_2$ in the recess; etching the conductive film so that a surface of the conductive film in the recess is at the same height as a surface of the interlayer insulating film or at a predetermined depth position from the surface of the interlayer insulating film; when the conductive film is formed of Cu, oxidizing the surface of the conductive film into CuO or $CuO_2$; selectively forming a first Ru film having a first film thickness only on a first surface, which is an exposed surface of the conductive film and is formed of one of Ru, $RuO_2$, Pt, Pd, CuO, and $CuO_2$, using an $Ru(EtCp)_2$ gas and an $O_2$ gas; and selectively forming a first $SiO_2$-containing film having a second film thickness only on a second surface, which is an exposed surface of the interlayer insulating film having OH groups, by performing one or more times a process of supplying TMA to the substrate to adsorb TMA only to the second surface and a process of forming an $SiO_2$ film only on a surface of the adsorbed TMA using a silanol group-containing silicon raw material and an oxidizing agent.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the present disclosure will now be described with reference to the drawings.

<Method of Manufacturing Semiconductor Device>

A method of manufacturing a semiconductor device according to one embodiment of the present disclosure will be described. In the present embodiment, a predetermined semiconductor device is manufactured using selective formation of a conductive film and an insulating film.

Figure 1:
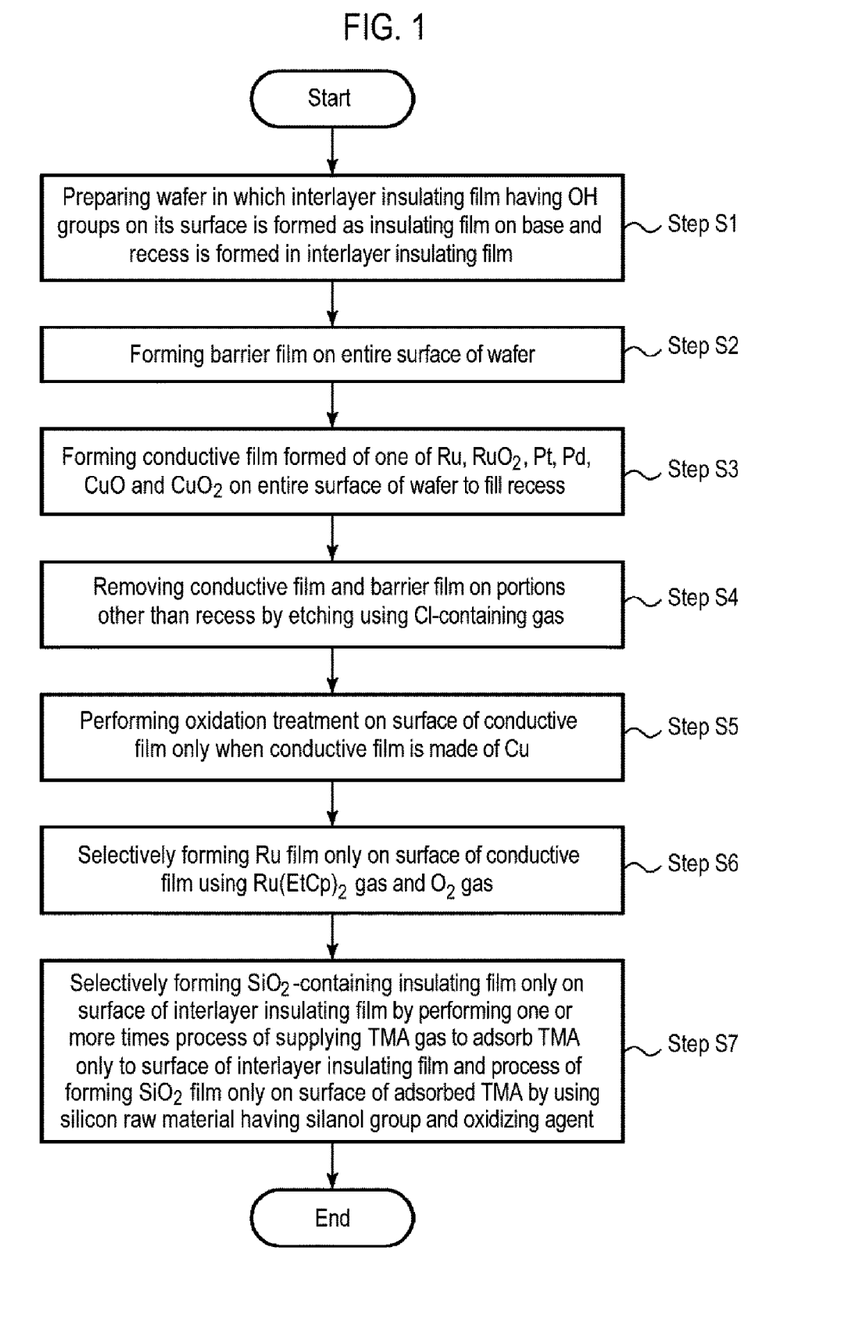
FIG. 1 is a flowchart illustrating a method of manufacturing a semiconductor device according to one embodiment of the present disclosure.

FIG. 1 is a flowchart illustrating a method of manufacturing a semiconductor device according to one embodiment of the present disclosure, and FIGS. 2A to 3C are sectional process views illustrating respective steps shown in FIG. 1.

Figure 2A:
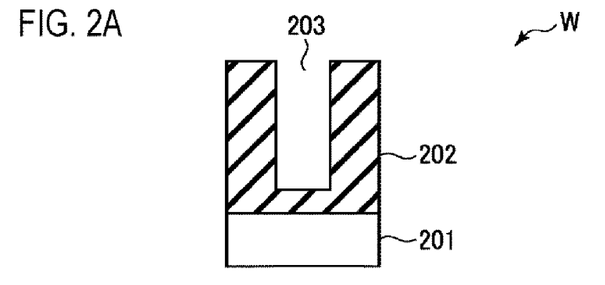
FIGS. 2A to 2D are sectional process views illustrating respective steps shown in FIG. 1.

First, a semiconductor wafer W (hereinafter, simply referred to as a "wafer") is prepared (step S1 and FIG. 2A). In the wafer W, an interlayer insulating film 202, which has OH groups on its surface formed of an $SiO_2$ film, a low dielectric constant (low-k) film such as SiCO or SiCOH, or the like, is formed as an insulating film on a base 201 having a predetermined structure, and a recess 203 such as a trench or a via hole is formed in the interlayer insulating film 202 in a predetermined pattern.

Figure 2B:
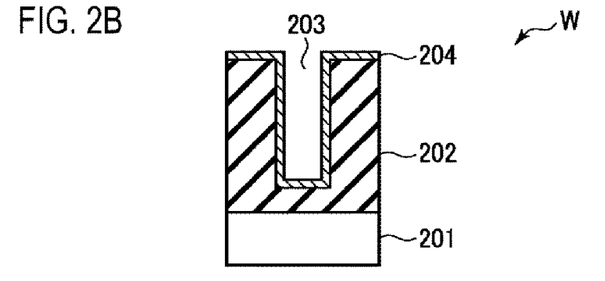

Subsequently, after a pretreatment for cleaning a surface of the wafer W is performed on the wafer W as necessary, a barrier film 204 is formed on the entire surface of the wafer W (step S2 and FIG. 2B). The barrier film may be formed by CVD, ALD, or the like.

As the barrier film 204, a nitride of Ti or Ta (TiN or TaN) or carbonsilicate thereof (TiSiCN or TaSiCN), a metal oxide such as MnO, NiO or HfO, or the like may be used. However, it is not essential to form the barrier film 204.

Figure 2C:
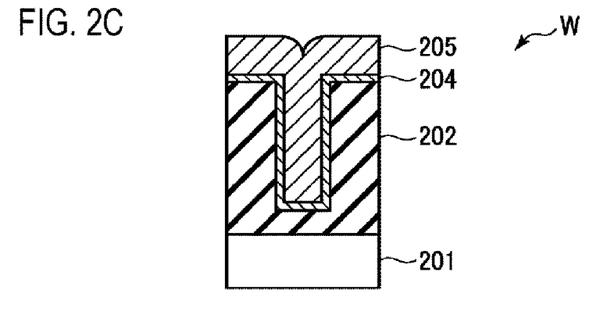

Next, a conductive film 205 is formed on the entire surface of the wafer W to bury the recess 203 (step S3 and FIG. 2C).

As the conductive film 205, an Ru film may be suitably used. In some embodiments, the Ru film may be formed by CVD or ALD. As the formation of the Ru film by CVD or ALD, thermal CVD using ruthenium carbonyl ($Ru_3(CO)_{12}$) as a film-forming raw material may be suitably used. This makes it possible to form a high-purity thin Ru film with high step coverage. Film forming conditions at this time may be, for example, an internal pressure of a process container within a range of 1.3 to 66.5 Pa (0.01 to 0.5 Torr) and a film-forming temperature (wafer temperature) within a range of 150 to 250 degrees C. Alternatively, cyclopentadienyl-based raw material may be used as a precursor.

When the recess is an elongated via hole, it is difficult to fill the recess and seams may remain at the center portion even by ALD using $Ru_3(CO)_{12}$. In this case, seamless filling may be performed by repeating formation of an Ru film and etching with a $ClF_3$ gas or the like.

The conductive film 205 may be an arbitrary film as long as an Ru film using an $Ru(EtCp)_2$ gas and an $O_2$ gas as described later can be selectively formed on the conductive film 205. In addition to Ru, $RuO_2$, Pt, Pd, Cu, CuO, and $CuO_2$ may be used as the conductive film 205. Among these materials, $RuO_2$, Pt, and Pd are more likely to selectively form an Ru film. Although CuO and $CuO_2$ also allow selective formation of an Ru film, a film-forming rate is lower than in the case of using $RuO_2$, Pt, or Pd.

In addition, it is difficult to form an Ru film on Cu as it is. Thus, when the conductive film 205 is made of Cu, the surface of the conductive film 205 is oxidized as described later.

Figure 2D:
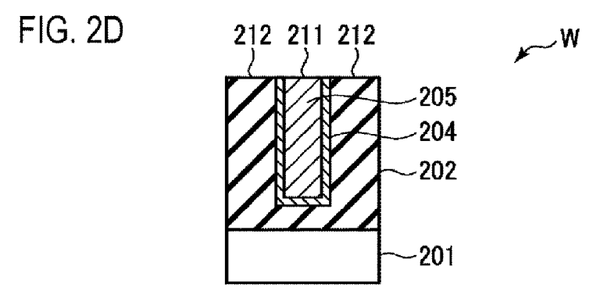

Subsequently, the conductive film 205 and the barrier film 204 formed on portions other than the recess 203 are removed by a chemical mechanical polishing (CMP) process or an etching process using a Cl-containing gas such as $ClF_3$ or the like (step S4 and FIG. 2D). The above-described removal may be performed such that the surface of the conductive film 205 in the recess 203 has the same height as the surface of the interlayer insulating film 202. The conductive film 205 in the recess 203 may be further recessed to the middle of the recess 203 such that the surface of the conductive film 205 is 20 nm lower than the surface of the interlayer insulating film 202. By recessing the conductive film 205 in this way, the inner wall of the interlayer insulating film 202 can serve as a guide for forming a selective Ru film as described later.

The etching with $ClF_3$ or the like may be performed under conditions in which the wafer temperature is set to 150 to 300 degrees C., the internal pressure of the process container is set to have the total pressure of 13.3 to 1,333 Pa (0.1 to 10 Torr) and the partial pressure of 6.65 to 66.5 Pa (0.05 to 5 Torr), and the process time is set to 60 to 1,200 seconds. This makes it possible to form a first surface 211, which is an exposed surface of the conductive film 205, and a second surface 212, which is an exposed surface of the interlayer insulating film 202, on the surface of the wafer W as a substrate to be processed. The $ClF_3$ may be intermittently supplied by flowing a $ClF_3$ gas flow and an inert gas flow alternately, or by flowing a $ClF_3$ gas flow and performing vacuum drawing alternately. By intermittently supplying the $ClF_3$, it is possible to obtain a smoother surface after etching than in the case of continuously supplying the $ClF_3$.

Figure 3A:
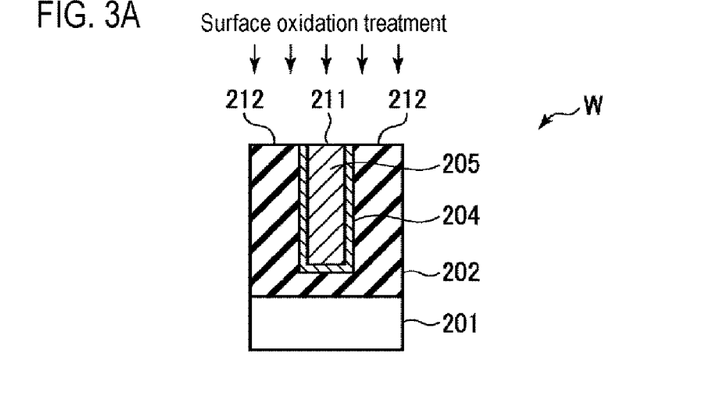
FIGS. 3A to 3C are sectional process views illustrating respective steps shown in FIG. 1.

Subsequently, only when the conductive film 205 is made of Cu, an oxidation treatment is performed on the surface of the conductive film 205 to oxidize Cu into CuO or $CuO_2$ (step S5 and FIG. 3A). The surface oxidation treatment is performed to allow the selective Ru film to be formed on the first surface 211 of the conductive film 205 because the selective Ru film is not formed on the surface of Cu by using the Ru(EtCp)$_2$ gas and the O$_2$ gas. The surface oxidation treatment may be performed by heating the wafer W while supplying an O$_2$ gas. Process conditions of the surface oxidation treatment may be the wafer temperature of 150 to 300 degrees C., the internal pressure of the process container having the total pressure of 13.3 to 1,333 Pa (0.1 to 10 Torr) and the partial pressure of 6.65 to 66.5 Pa (0.05 to 5 Torr), and the process time of 60 to 1,200 seconds. As an oxidizing gas, O$_3$, H$_2$O, H$_2$O$_2$, NO, or NO$_2$ may be used instead of O$_2$. The oxidizing gas may be supplied while generating plasma, or may be supplied after being excited with remote plasma.

Figure 3B:
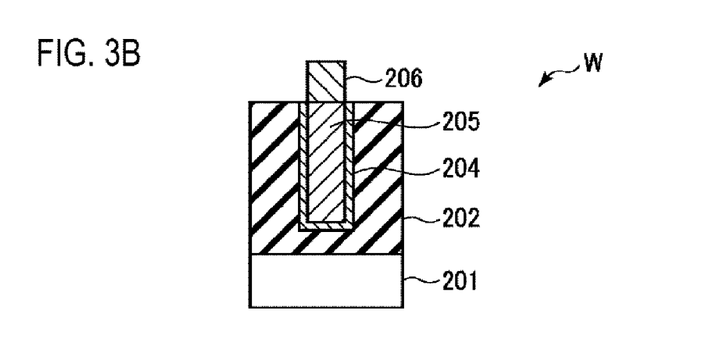

Subsequently, an Ru film 206 is selectively formed only on the first surface 211, which is the exposed surface of the conductive film 205, using the Ru(EtCp)$_2$ gas and the O$_2$ gas (step S6 and FIG. 3B).

In forming the Ru film using the Ru(EtCp)$_2$ gas and the O$_2$ gas, the Ru film 206 is basically not formed on the insulating film but is formed only on the first surface 211 which is the exposed surface of the conductive film 205, as long as the film-forming temperature is a temperature at which the autolysis reaction of the Ru(EtCp)$_2$ gas does not occur.

The term "basically not formed" used herein means that the Ru film 206 is not formed on an insulating film if the interlayer insulating film 202 as the insulating film has film quality as designed. When there is dust on the surface of the interlayer insulating film 202 or, particularly, when a residue of the conductive film during etching in step S4 remains on the surface of the interlayer insulating film 202, selection or blurring (film formation on the insulating film) is likely to occur with the residue as a starting point and thus Ru may grow in a shape of islands. Therefore, in some embodiments, in order to prevent deterioration of the insulating property of the interlayer insulating film 202, the wafer W may be sufficiently cleaned after the recess 203 is formed in the interlayer insulating film 202 as shown in FIG. 2A to prevent adhesion of dust to the surface of the interlayer insulating film 202, and residues of the conductive film 205 and the barrier film 204 during etching in step S4, particularly, the residue of the conductive film 205 may be prevented from remaining on the surface of the interlayer insulating film 202. Further, when plasma is used in the surface oxidation treatment of step S5, the interlayer insulating film 202 may be damaged and therefore the Ru(EtCp)$_2$ gas and the O$_2$ gas may show a behavior similar to the case where the underlayer is the conductive film 205. In this case, there is a possibility that selection or blurring may occur with the damaged portion as a starting point. Thus, in some embodiments, when using plasma in the surface oxidation treatment, plasma damage of the interlayer insulating film 202 may be prevented by adjusting plasma conditions.

The Ru film 206 in step S6 may be formed by CVD in which the Ru(EtCp)$_2$ gas and the O$_2$ gas are supplied simultaneously. At this time, the wafer temperature is set to 250 to 350 degrees C. and the internal pressure (total pressure) of the process container is set to 66.5 to 665 Pa (0.5 to 5 Torr). Under these conditions, a container storing Ru(EtCp)$_2$ in a liquid state is heated to 60 to 100 degrees C. and a carrier gas such as an Ar gas is supplied into the container, thereby transferring Ru(EtCp)$_2$ in a gaseous state to the process container. In addition, the O$_2$ gas and a dilution gas such as an Ar gas are supplied into the process container, thereby forming an Ru film having a predetermined film thickness. Gas flow rates at this time may be an O$_2$ gas flow rate of 10 to 500 sccm, a carrier gas flow rate of 50 to 500 sccm, and a dilution gas flow rate of 10 to 1,000 sccm. The process time may be appropriately set depending on a film thickness, and may be about 300 to 1,200 seconds. In some embodiments, the conditions may be the wafer temperature of 320 degrees C., the total pressure of 266 Pa (2 Torr), the container temperature of 80 degrees C., the gas flow rates of O$_2$/carrier Ar/dilution Ar=30/150/300 sccm. The film-forming rate tends to decrease at a lower temperature, a lower O$_2$ gas flow rate, and a lower carrier gas flow rate than in the above-described conditions, and selection or blurring tends to easily occur at a higher temperature and a higher O$_2$ gas flow rate than in the above-described conditions. The method of forming the Ru film 206 is not limited to CVD but may be ALD that alternately supplies the Ru(EtCp)$_2$ gas and the O$_2$ gas with a purge operation in the process container interposed therebetween. In some embodiments, conditions of the ALD method may be the wafer temperature of 320 degrees C., the total pressure of 266 Pa (2 Torr), the container temperature of 80 degrees C., the gas flow rates of O$_2$/carrier Ar/dilution Ar=30/150/300 sccm during the supply of an Ru raw material gas, the gas flow rates of O$_2$/carrier Ar/dilution Ar=0/0/480 sccm during the purge, and the gas flow rates of O$_2$/carrier Ar/dilution Ar=180/0/300 sccm during the supply of the O$_2$ gas. Under these conditions, one cycle is set by the Ru raw material gas supply-purge-O$_2$ supply-purge=5-5-5-5 seconds, and a desired number of the cycles is repeated.

Although a thickness of the Ru film 206 may vary depending on its applications, in some embodiments, the thickness may fall within a range of, for example, 3 to 50 nm. In this case, the position of the surface of the Ru film 206 may be the same as, lower than, or higher than the height position of the surface of the interlayer insulating film 202.

Next, an SiO$_2$-containing insulating film 207 having a predetermined film thickness is selectively formed only on the second surface 212 (step S7 and FIG. 3C) by performing one or more times a process of supplying a trimethylaluminum (TMA) gas to the wafer W to adsorb TMA only to the second surface 212 which is the exposed surface of the interlayer insulating film 202, and a process of forming an SiO$_2$ film only on the surface of the adsorbed TMA by using a silanol group-containing silicon raw material and an oxidizing agent.

Figure 3C:
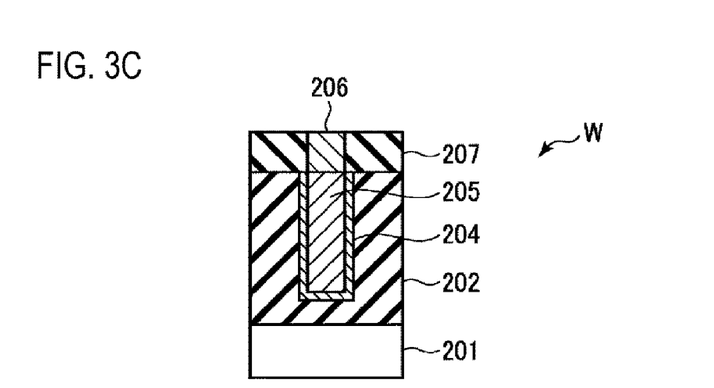

TMA has a property to be adsorbed only to a surface having OH groups. Therefore, TMA is adsorbed to the interlayer insulating film 202 having OH groups, but is not adsorbed to the Ru film 206 having no OH group. Further, since the silanol group-containing silicon raw material is adsorbed to TMA and is not adsorbed to a metal film such as the Ru film 206, the SiO$_2$ film is formed only on TMA. Since this reaction forms a film having a thickness of at most about 10 nm per one time, the SiO$_2$-containing insulating film 207 formed of Al$_2$O$_3$ and SiO$_2$ having a predetermined film thickness is selectively formed only on the second surface 212 which is the exposed surface of the interlayer insulating film 202 by performing the above-described processes one or more times. The process of forming the SiO$_2$ film may be performed by CVD that simultaneously supplies the silanol group-containing silicon raw material gas and the oxidizing agent or by ALD that alternately supplies the silanol group-containing silicon raw material gas and the oxidizing agent with a purge operation in the process container interposed therebetween. As the oxidizing agent, an O$_2$ gas, an H$_2$O gas, an NO gas, an O$_3$ gas, or the like may be used. Plasmarized O$_2$ may be introduced from the outside of the process chamber.

After step S6, if the wafer W is exposed to the atmosphere, the OH groups may adhere to the surface of the Ru film 206. Thus, in some embodiments, step S7 may be performed without being exposed to the atmosphere after step S6.

Basically, the OH groups exist on the surface of the interlayer insulating film 202. However, if a portion of the OH groups has been removed by the processes of steps S2 to S5 described above, the OH groups can be generated by a process using an $O_3$ gas. Even in this case, no OH group is generated on the surface of the Ru film 206.

As the silanol group-containing silicon raw material, tris(tert-pentoxy)silanol (TPSOL), tris(tert-butoxy)silanol (TBSOL), or the like may be suitably used.

Film forming conditions of step S7 may be the wafer temperature of 200 to 300 degrees C., the internal pressure (total pressure) in the process container of 66.5 to 1,330 Pa (0.5 to 10 Torr), the TMA gas flow rate of 10 to 50 sccm, the carrier gas flow rate of 50 to 500 sccm during the supply of the silanol group-containing silicon raw material gas such as TPSOL or the like using bubbling, and the flow rate of the oxidizing agent such as an $O_2$ gas of 30 to 500 sccm.

Although a thickness of the $SiO_2$-containing insulating film 207 may vary depending on its applications, in some embodiments, the thickness may fall within a range of, for example, 1 to 10 nm. In this case, the position of the surface of the $SiO_2$-containing insulating film 207 may be the same as, lower than, or higher than the height position of the surface of the Ru film 206.

By performing the aforementioned processes, in the wafer W in which the interlayer insulating film 202 is formed on the surface of the wafer W and the recess 203 of a predetermined pattern is formed on the surface of the interlayer insulating film 202, it is possible to fill the recess 203 with the conductive film 205 and to selectively form the conductive film (the Ru film 206) and the insulating film (the $SiO_2$-containing insulating film 207) on the first surface 211, which is the exposed surface of the conductive film 205, and the second surface 212, which is the exposed surface of the interlayer insulating film 202, respectively, with sufficient selectivity. Any one of step S6 and step S7 described above may be performed first.

In step S6, the Ru film 206 is selectively formed so as to have a height of about 50 nm from the surface of the conductive film 205. Next, in step S7, the $SiO_2$-containing insulating film 207 is selectively formed on the surface of the interlayer insulating film 202 and the Ru film 206 is polished by CMP or the like as necessary, whereby an Ru wiring is formed as a second layer wiring. Therefore, no misalignment of the connection portion of the contact portion with the lower layer wiring occurs. Further, when the Ru film 206 is removed and Cu is buried instead, a Cu wiring can be used as the second layer wiring.

When Ru is used as a wiring, it is necessary to reduce a resistance of the wiring. In order to reduce the resistance of the Ru wiring, in some embodiments, annealing in an inert gas atmosphere may be performed at 450 to 550 degrees C. This makes it possible to coarse the crystal grains so as to reduce the resistance. In addition, after the recess 203 such as a trench or a via hole is formed in the interlayer insulating film 202, a thin film made of a material which serves as a high barrier from the viewpoint of Ru and has low electron affinity, such as NiO, HfO, or the like, may be formed over the entire surface. In this way, the interface scattering effect is suppressed, thereby reducing the resistance.

Figure 4:
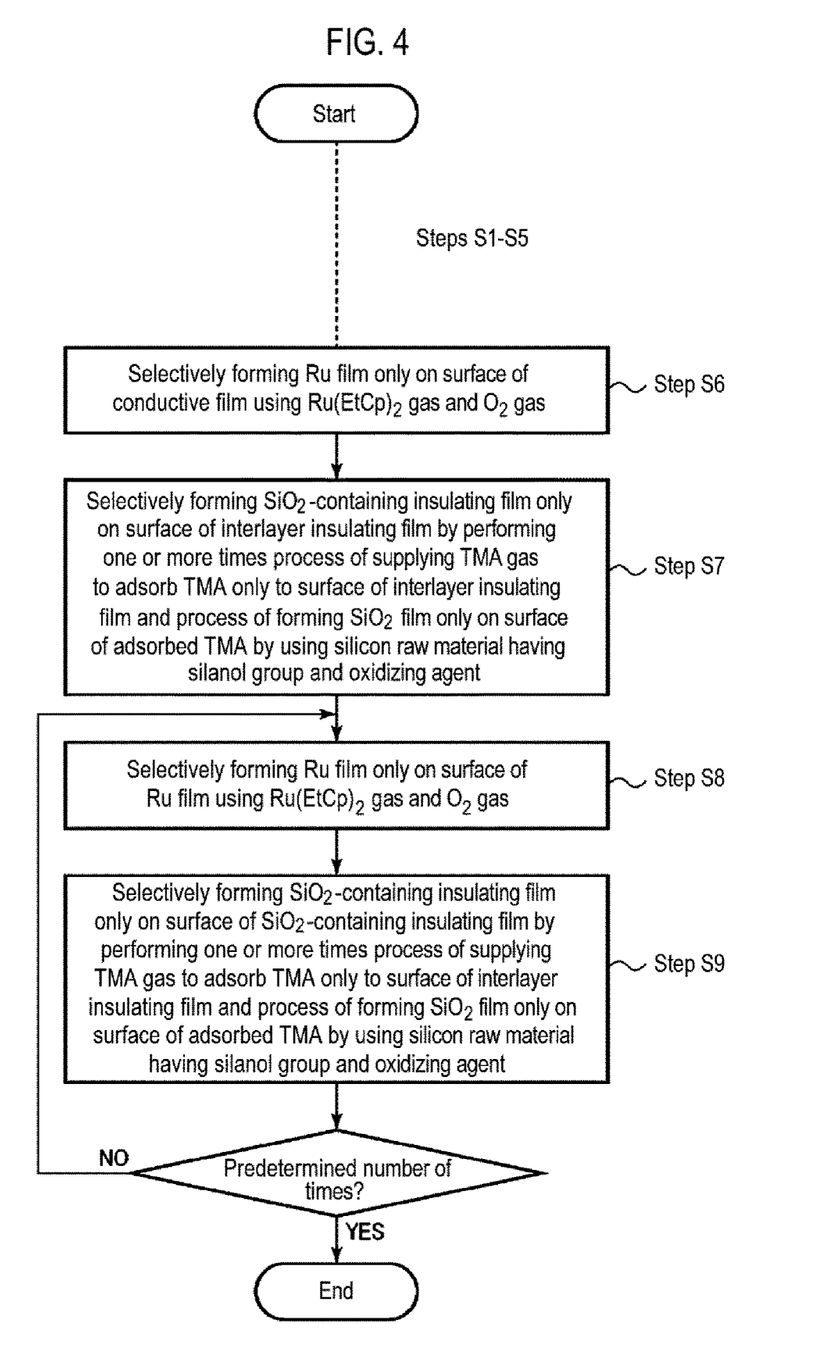
FIG. 4 is a flowchart illustrating a method of manufacturing a semiconductor device according to another embodiment of the present disclosure.

As illustrated in a flowchart of FIG. 4, after selectively forming the Ru film 206 in step S6 and the $SiO_2$-containing insulating film 207 in step S7, a step of forming an Ru film 208 on the surface of the Ru film 206 in the same manner as in step S6 (step S8) and a step of forming an $SiO_2$-containing insulating film 209 on the surface of the $SiO_2$-containing insulating film 207 in the same manner as in step 7 (step S9) may be performed once or may be alternately performed multiple times.

Figure 5:
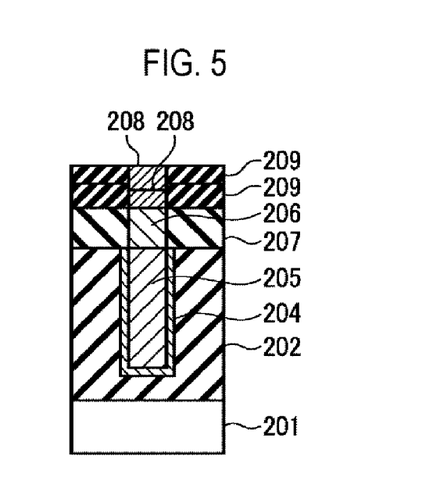
FIG. 5 is a sectional view illustrating a structure obtained by the method of FIG. 4.

At this time, in step S8, the Ru film 208 is formed only on the surface of the Ru film 206, and the $SiO_2$-containing insulating film 209 is formed only on the surface of the $SiO_2$-containing insulating film 207. Therefore, as illustrated in FIG. 5, it is possible to form the Ru film 208 and the $SiO_2$-containing insulating film 209 to a desired thickness in a self-aligning manner.

At this time, the Ru film 206 formed in step S6 and the Ru films 208 can be formed at a height of about 1 to 30 nm from the surfaces of the interlayer insulating film 202 and the $SiO_2$-containing insulating films 207 and 209, respectively, and the $SiO_2$-containing insulating film 207 and the $SiO_2$-containing insulating films 209 can be formed at the same height as the surfaces of the Ru film 206 and the Ru films 208 or at a height of about 10 nm from the surfaces of the Ru film 206 and the Ru films 208, respectively.

Figure 6A:
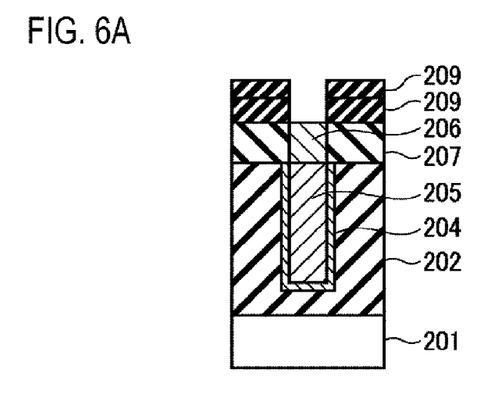
FIG. 6A is a sectional view illustrating a state where an Ru film 208 is removed from the structure shown in FIG. 5.
Figure 6B:
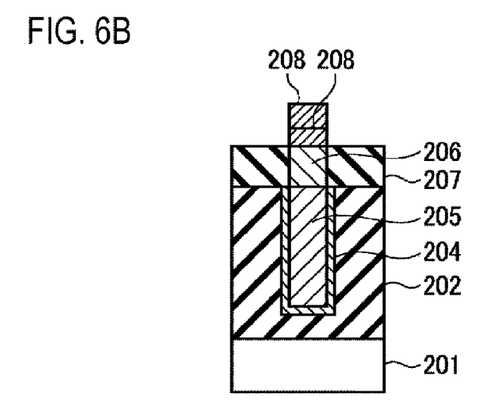
FIG. 6B is a sectional view illustrating a state where an $SiO_2$-containing insulating film 209 is removed from the structure shown in FIG. 5.

After the Ru films 206 and 208 and the $SiO_2$-containing insulating films 207 and 209 having the predetermined thicknesses are formed as described above, either the Ru films 208 or the $SiO_2$-containing insulating films 209 is removed to leave necessary films as illustrated in FIGS. 6A and 6B. Thus, it is possible to use the remaining films for connection alignment of the upper layer wiring or the like.

<Film Forming System>

Next, an example of a film forming system used for implementing the method of manufacturing a semiconductor device according to the present embodiment will be described.

Figure 7:
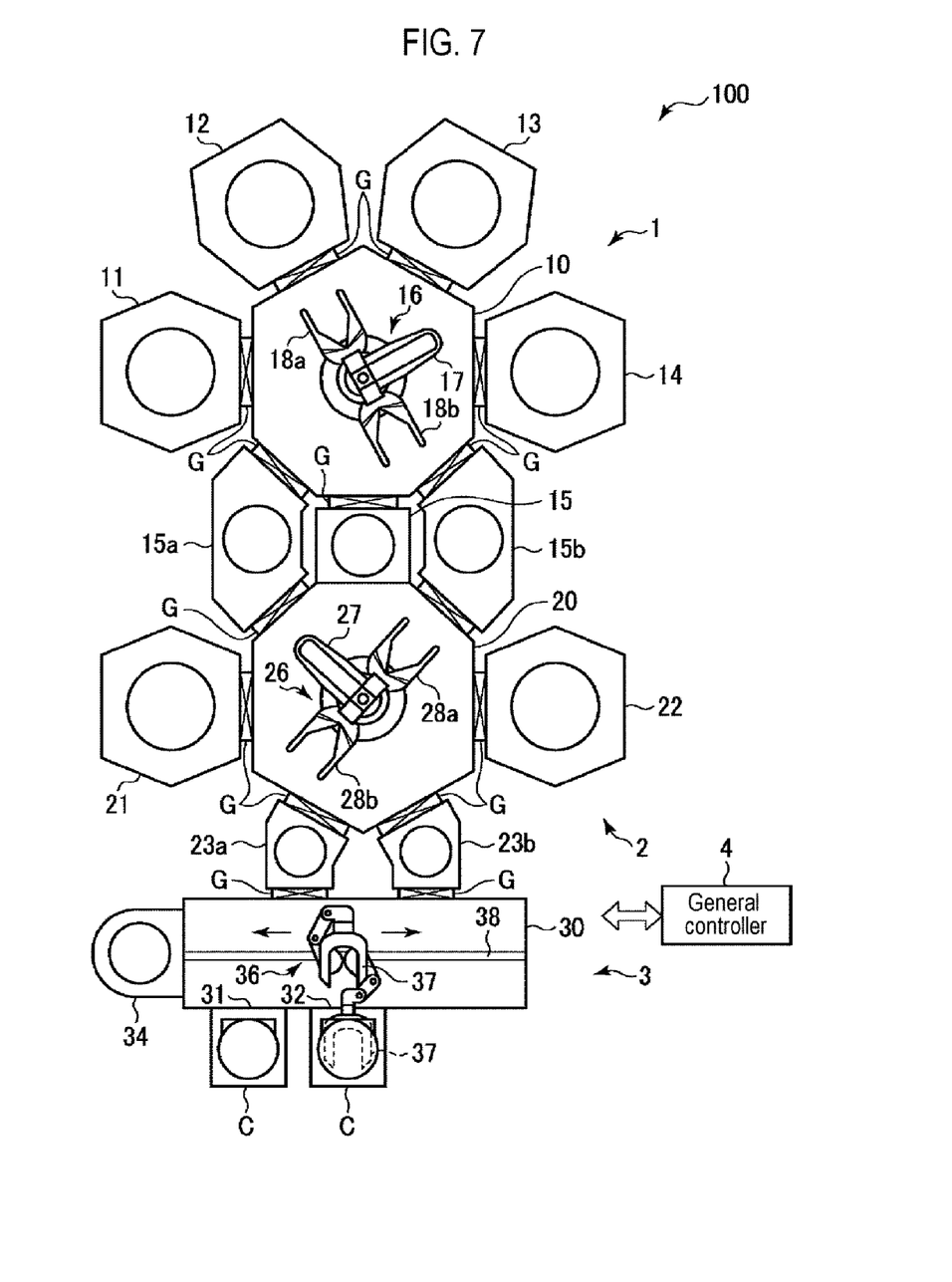
FIG. 7 is a plan view schematically illustrating an example of a film forming system used to implement a method of manufacturing a semiconductor device according to an embodiment of the present disclosure.

FIG. 7 is a plan view schematically illustrating an example of such a film forming system. A film forming system 100 includes a first processing part 1, a second processing part 2, a loading/unloading part 3, and a general controller 4.

The first processing part 1 includes a first vacuum transfer chamber 10, and a barrier film forming apparatus 11, a conductive film forming apparatus 12, an etching apparatus 13, and an oxidization apparatus 14, which are connected to wall portions of the first vacuum transfer chamber 10.

Degassing chambers 15a and 15b in which a degas process for the wafer W is performed are connected to other wall portions of the first vacuum transfer chamber 10. In addition, a transfer chamber 15 for transferring the wafer W between the first vacuum transfer chamber 10 and a second vacuum transfer chamber 20 as described later is connected to a wall portion of the first vacuum transfer chamber 10 between the degassing chambers 15a and 15b.

The barrier film forming apparatus 11, the conductive film forming apparatus 12, the etching apparatus 13, the oxidation apparatus 14, the degassing chambers 15a and 15b, and the transfer chamber 15 are connect to the respective wall portions of the first vacuum transfer chamber 10 via gate valves G.

The interior of the first vacuum transfer chamber 10 is kept in a predetermined vacuum atmosphere, and a first transfer mechanism 16 for transferring the wafer W is installed in the interior of the first vacuum transfer chamber 10. The first transfer mechanism 16 has a rotation and expansion/contraction part 17 and two wafer transfer arms 18a and 18b installed at leading ends of the rotation and expansion/contraction part 17. The first transfer mechanism 16 loads and unloads the wafer W into and from the barrier film forming apparatus 11, the conductive film forming apparatus 12, the etching apparatus 13, the oxidation apparatus 14, the degassing chambers 15a and 15b, and the transfer chamber 15.

The second processing part 2 includes the second vacuum transfer chamber 20, and an Ru film forming apparatus 21 and an $SiO_2$-containing film forming apparatus 22 respectively connected to opposing wall portions of the second vacuum transfer chamber 20.

The degassing chambers 15a and 15b are connected to two wall portions of the second vacuum transfer chamber 20 on the first processing part 1 side, respectively, and the transfer chamber 15 is connected to the wall portion of the second vacuum transfer chamber 20 between the degassing chambers 15a and 15b. That is to say, all of the transfer chamber 15 and the degassing chambers 15a and 15b are installed between the first vacuum transfer chamber 10 and the second vacuum transfer chamber 20. In addition, load lock chambers 23a and 23b, which allow atmospheric transfer and vacuum transfer, respectively, are connected to two wall portions of the second vacuum transfer chamber 20 on the loading/unloading part 3 side.

The Ru film forming apparatus 21, the $SiO_2$-containing film forming apparatus 22, the degassing chambers 15a and 15b, and the load lock chambers 23a and 23b are connected to the respective wall portions of the second vacuum transfer chamber 20 via gate valves G. The transfer chamber 15 is connected to the second vacuum transfer chamber 20 without interposing any gate valve between the transfer chamber 15 and the second vacuum transfer chamber 20.

The interior of the second vacuum transfer chamber 20 is kept in a predetermined vacuum atmosphere, and a second transfer mechanism 26 for transferring the wafer W is installed in the interior of the second vacuum transfer chamber 20. The second transfer mechanism 26 has a rotation and expansion/contraction part 27 and two wafer transfer arms 28a and 28b installed at leading ends of the rotation and expansion/contraction part 27. The second transfer mechanism 26 loads and unloads the wafer W into and from the Ru film forming apparatus 21, the $SiO_2$-containing film forming apparatus 22, the degassing chambers 15a and 15b, the load lock chambers 23a and 23b, and the transfer chamber 15.

The loading/unloading part 3 is installed at the opposite side of the second processing part 2 with the load lock chambers 23a and 23b interposed between the second processing part 2 and the loading/unloading part 3, and has an atmospheric transfer chamber 30 to which the load lock chambers 23a and 23b are connected. Gate valves G are installed in wall portions between the load lock chambers 23a and 23b and the atmospheric transfer chamber 30. Two connection ports 31 and 32 to which carriers C that accommodate wafers W are connected are installed in wall portions of the atmospheric transfer chamber 30 opposite to the wall portions to which the load lock chambers 23a and 23b are connected. In addition, an alignment chamber 34 for aligning the wafers W is installed on the side surface of the atmospheric transfer chamber 30. An atmospheric transfer mechanism 36 for loading and unloading the wafers W into and from the carriers C and the load lock chambers 23a and 23b is installed inside the atmospheric transfer chamber 30. The atmospheric transfer mechanism 36 has two multi-joint arms and can move on a rail 38 along the arrangement direction of the carriers C. The atmospheric transfer mechanism 36 transfers the wafers W with the wafers W held on a hand 37 of each leading end of the atmospheric transfer mechanism 36.

The general controller 4 includes a main controller, an input device (a keyboard, a mouse, or the like), an output device (a printer or the like), a display device (a display or the like), and a storage device (storage medium). The main controller has a CPU (computer) that controls respective components of the barrier film forming apparatus 11, the conductive film forming apparatus 12, the etching apparatus 13, the oxidation apparatus 14, the Ru film forming apparatus 21, and the $SiO_2$-containing film forming apparatus 22, exhaust mechanisms and the transfer mechanisms 16 and 26 of the vacuum transfer chambers 10 and 20, exhaust mechanisms and gas supply mechanisms of the degassing chambers 15a and 15b and the load lock chambers 23a and 23b, the transfer mechanism 36 of the atmospheric transfer chamber 30, and a drive system of the gate valves G, or the like. The main controller of the general controller 4 causes the film forming system 100 to execute a predetermined operation based on a process recipe stored in, for example, a storage medium incorporated in the storage device or a storage medium set in the storage device.

In the film forming system 100, the wafer W is discharged from the carrier C by the atmospheric transfer mechanism 36 and transferred to the load lock chamber 23a or 23b. The load lock chamber 23a or 23b to which the wafer W is transferred is depressurized to the same degree of vacuum as that of the second vacuum transfer chamber 20. Then, the wafer W in the load lock chamber 23a or 23b is transferred to the degassing chamber 15a or 15b by the second transfer mechanism 26 and is subjected to a degas process. Thereafter, the wafer W in the degassing chamber 15a or 15b is discharged by the first transfer mechanism 16 and loaded into the barrier film forming apparatus 11, and a barrier film formed of a TaN film, a TiN film, or the like is formed. The barrier film is formed by ALD, CVD, PVD, or the like. After the barrier film is formed, the wafer W is transferred to the conductive film forming apparatus 12 by the first transfer mechanism 16, and a conductive film formed of one of Ru, $RuO_2$, Pt, Pd, Cu, CuO, and $CuO_2$ is formed by CVD or the like to fill a recess such as a trench or a via hole formed in the wafer W.

After the conductive film is formed, the wafer W is transferred from the conductive film forming apparatus 12 to the etching apparatus 13 by the first transfer mechanism 16, and the conductive film and the barrier film formed on portions other than the recess are removed by etching using a Cl-containing gas such as $ClF_3$. Subsequently, when the conductive film is made of Cu, the wafer W is transferred to the oxidation apparatus 14 by the first transfer mechanism 16, in which the surface of the conductive film is oxidized.

Thereafter, the wafer W is transferred to the transfer chamber 15 by the first transfer mechanism 16. The wafer W is discharged from the transfer chamber 15 and loaded into the Ru film forming apparatus 21 by the second transfer mechanism 26. In the Ru film forming apparatus 21, the Ru film is selectively formed on the surface of the conductive film using the $Ru(EtCp)_2$ gas and the $O_2$ gas. After the Ru film is formed, the wafer W is discharged by the second transfer mechanism 26 and loaded into the $SiO_2$-containing film forming apparatus 22. In the $SiO_2$-containing film forming apparatus 22, a process of supplying a TMA gas and selectively adsorbing TMA to the surface of the interlayer insulating film and a process of forming an $SiO_2$ film only on the surface of the adsorbed TMA using a silanol group-containing silicon raw material and an oxidizing agent are performed one or more times, thereby selectively forming an SiO$_2$-containing insulating film on the surface of the interlayer insulating film. The process of forming the Ru film in the Ru film forming apparatus 21 and the process of forming the SiO$_2$-containing insulating film in the SiO$_2$-containing film forming apparatus 22 may be repeated multiple times.

Thereafter, the wafer W is transferred to the load lock chamber 23a or 23b by the second transfer mechanism 26. After the load lock chamber 23a or 23 is returned to atmospheric pressure, the wafer W is discharged from the load lock chamber 23a or 23b and returned to the carrier C by the atmospheric transfer mechanism 36. The above-described processes are repeated by the number of wafers W in the carrier C.

<Film Forming Apparatus>

Next, a film forming apparatus used as the Ru film forming apparatus 21 or the SiO$_2$-containing film forming apparatus 22 in the film forming system of FIG. 7 will be described.

Figure 8:
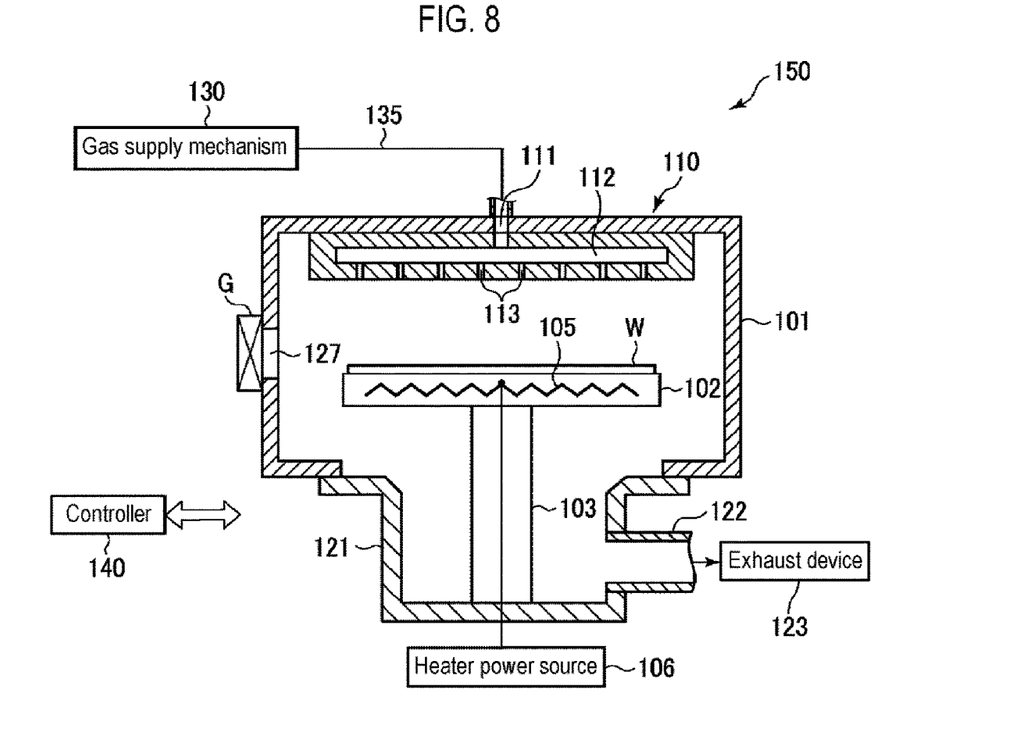
FIG. 8 is a sectional view schematically illustrating an example of a film forming apparatus used as an Ru film forming apparatus or an $SiO_2$-containing film forming apparatus in the film forming system of FIG. 7.

FIG. 8 is a sectional view schematically illustrating an example of the film forming apparatus used as the Ru film forming apparatus 21 or the SiO$_2$-containing film forming apparatus 22. A film forming apparatus 150 has a substantially cylindrical process container 101 which is airtightly configured. In the process container 101, a susceptor 102 that supports a wafer W as a substrate to be processed in a horizontal posture is disposed while being supported by a cylindrical support member 103 installed at the center of the bottom wall of the process container 101. A heater 105 is embedded in the susceptor 102. The heater 105 heats the wafer W as the substrate to be processed to a predetermined temperature by electric power supplied from a heater power source 106. In addition, a plurality of wafer elevating pins (not shown) for supporting and elevating the wafer W is installed in the susceptor 102 so as to be protruded and depressed from the surface of the susceptor 102.

A shower head 110 for introducing a processing gas for film formation to the process container 101 in a shower shape is installed on a ceiling wall of the process container 101 so as to face the susceptor 102. The shower head 110 is configured to discharge a gas supplied from a gas supply mechanism 130, which will be described later, into the process container 101, and a gas inlet port 111 for introducing a gas is formed in an upper portion of the shower head 110. Further, a gas diffusion space 112 is formed inside the shower head 110, and a plurality of gas discharge holes 113 that communicates with the gas diffusion space 112 is formed on the bottom surface of the shower head 110.

An exhaust chamber 121 that protrudes downward is installed on the bottom wall of the process container 101. An exhaust pipe 122 is connected to the side surface of the exhaust chamber 121, and an exhaust device 123 having a vacuum pump, a pressure control valve, and the like is connected to the exhaust pipe 122. By operating the exhaust device 123, the interior of the process container 101 can be brought into a predetermined depressurization (vacuum) state.

A loading/unloading port 127 for loading and unloading the wafer W into and from the vacuum transfer chamber is installed on a sidewall of the process container 101, and the loading/unloading port 127 is configured to be opened and closed by a gate valve G.

The gas supply mechanism 130 includes supply sources of gases necessary for film formation, an individual pipe for supplying a gas from each of the supply sources, an opening/closing valve installed in the individual pipe, and a flow rate controller such as a mass flow controller for controlling the flow rate of a gas. The gas supply mechanism 130 further includes a gas supply pipe 135 for guiding the gas from the individual pipe to the shower head 110 via the gas inlet port 111.

When the film forming apparatus 150 is an Ru film forming apparatus, the gas supply mechanism 130 includes a container for storing Ru(EtCp)$_2$ in a liquid state, a heater for heating the container, a supply source for supplying a carrier gas to the container, and supply sources and individual pipes for supplying each of an O$_2$ gas, a dilution gas, a purge gas (inert gas) and the like to the shower head 110. When the film forming apparatus 150 is an SiO$_2$-containing insulating film forming apparatus, the film forming apparatus 150 includes supply sources and individual pipes for supplying a TMA gas, a silanol group-containing Si raw material gas, an oxidizing agent, a purge gas (inert gas), and the like, respectively.

The film forming apparatus 150 further includes a controller 140 for controlling respective components of the film forming apparatus 150, for example, the heater power source 106, the exhaust device 123, the valve of the gas supply mechanism 130, the mass flow controller, and the like. The controller 140 controls the respective components according to a command from the general controller 4.

In the film forming apparatus 150 configured as described above, the gate valve G is opened to carry the wafer W into the process container 101 from the loading/unloading port 127, and to the wafer W is mounted on the susceptor 102. The susceptor 102 is heated to a predetermined temperature by the heater 105. Thus, the wafer W is heated by introducing an inert gas into the process container 101. Then, the interior of the process container 101 is exhausted by the vacuum pump of the exhaust device 123 such that the internal pressure of the process container 101 is adjusted to a predetermined pressure.

Next, when an Ru film is formed, an Ru(EtCp)$_2$ gas and an O$_2$ gas are supplied from the gas supply mechanism 130 simultaneously or alternately with a purge process in the process container 101 interposed therebetween. When an SiO$_2$-containing insulating film is formed, a TMA gas is supplied, and then a silanol group-containing silicon raw material gas and an oxidizing agent are supplied simultaneously or alternately with a purge process in the process container 101 interposed therebetween. These gases are introduced into the process container 101 via the shower head 110. In this way, an Ru film or an SiO$_2$-containing insulating film is formed on the surface of the wafer W.

After the film forming process is completed, the interior of the process container 101 is purged, and the gate valve G is opened to unload the wafer W via the loading/unloading port 127 by the second transfer mechanism 26.

Then, the gate valve G of the barrier film forming apparatus 11 is opened and the wafer W held by one of the transfer arms 18a and 18b of the first transfer mechanism 16 is loaded into the barrier film forming apparatus 11. Then, the gate valve G is closed and a barrier film is formed on the wafer W.

After the film forming process of the barrier film is completed, the gate valve G is opened to unload the wafer W by one of the transfer arms 18a and 18b of the first transfer mechanism 16, and the gate valve G of the conductive film forming apparatus 12 is opened to load the wafer W into the conductive film forming apparatus 12. Then, the gate valve G is closed and a conductive film is formed on the wafer W as described above.

When the barrier film or the conductive film is formed by CVD or ALD, the film can be formed by using a film forming apparatus having the similar configuration to that of the film forming apparatus 150.

<Other Applications>

While one embodiment of the present disclosure has been described above, the present disclosure is not limited to the aforementioned embodiment but may be differently modified without departing from the spirit of the present disclosure.

For example, in the aforementioned embodiment, there has been described an example in which an interlayer insulating film is used as an insulating film having a recess, but the present disclosure is not limited thereto and other insulating films may be used. In addition, there has been described a case where a conductive film is buried in the recess of the interlayer insulating film has been described, but the present disclosure is not limited thereto and is applicable to any substrate as long as it is a substrate to be processed in which the conductive film and the insulating film are exposed to the surface of the substrate. Further, in the aforementioned embodiment, there has been described a case where a semiconductor wafer is used as a substrate to be processed, but the substrate to be processed is not limited to the semiconductor wafer.

According to the present disclosure in some embodiments, it is possible to provide a selective film forming method and a method of manufacturing a semiconductor device, capable of forming a conductive film on an exposed surface of another conductive film and forming an insulating film on a surface of another insulating film with sufficient selectivity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A selective film forming method of selectively forming a thin film on a substrate to be processed in which a conductive film and an insulating film are exposed to a surface of the substrate,
    wherein a first surface which is an exposed surface of the conductive film is formed of one of Ru, $RuO_2$, Pt, Pd, CuO, and $CuO_2$, and a second surface which is an exposed surface of the insulating film has OH groups, and
    wherein the method comprises:
    selectively forming a first Ru film having a first film thickness only on the first surface using an $Ru(EtCp)_2$ gas and an $O_2$ gas; and
    selectively forming a first $SiO_2$-containing insulating film having a second film thickness only on the second surface by performing one or more times a process of supplying a TMA gas to the substrate to adsorb TMA only to the second surface and a process of forming an $SiO_2$ film only on a surface of the adsorbed TMA using a silanol group-containing silicon raw material and an oxidizing agent.

2. The selective film forming method of claim 1, further comprising:
    selectively forming a second Ru film only on a surface of the first Ru film using the $Ru(EtCp)_2$ gas and the $O_2$ gas; and
    selectively forming a second $SiO_2$-containing insulating film having a third film thickness only on a surface of the first $SiO_2$-containing insulating film by performing one or more times a process of adsorbing TMA only to the surface of the first $SiO_2$-containing insulating film and a process of forming an $SiO_2$ film only on a surface of the adsorbed TMA using the silanol group-containing silicon raw material and the oxidizing agent,
    wherein the process of selectively forming the second Ru film and the process of selectively forming the second $SiO_2$-containing insulating film are performed once or alternately performed multiple times.

3. The selective film forming method of claim 1, wherein the silanol group-containing silicon raw material is tris(tert-pentoxy)silanol (TPSOL) or tris(tert-butoxy)silanol (TBSOL).

4. A method of manufacturing a semiconductor device, comprising:
    preparing a substrate to be processed having an interlayer insulating film formed on a surface of the substrate, the interlayer insulating film having a recess of a predetermined pattern formed on a surface of the interlayer insulating film;
    burying a conductive film formed of one of Ru, $RuO_2$, Pt, Pd, Cu, CuO, and $CuO_2$ in the recess;
    etching the conductive film so that a surface of the conductive film in the recess is at the same height as a surface of the interlayer insulating film or at a predetermined depth position from the surface of the interlayer insulating film;
    when the conductive film is formed of Cu, oxidizing the surface of the conductive film into CuO or $CuO_2$;
    selectively forming a first Ru film having a first film thickness only on a first surface, which is an exposed surface of the conductive film and is formed of one of Ru, $RuO_2$, Pt, Pd, CuO, and $CuO_2$, using an $Ru(EtCp)_2$ gas and an $O_2$ gas; and
    selectively forming a first $SiO_2$-containing insulating film having a second film thickness only on a second surface, which is an exposed surface of the interlayer insulating film having OH groups, by performing one or more times a process of supplying TMA to the substrate to adsorb TMA only to the second surface and a process of forming an $SiO_2$ film only on a surface of the adsorbed TMA using a silanol group-containing silicon raw material and an oxidizing agent.

5. The method of claim 4, further comprising:
    selectively forming a second Ru film only on a surface of the first Ru film using the $Ru(EtCp)_2$ gas and the $O_2$ gas; and
    selectively forming a second $SiO_2$-containing insulating film having a third film thickness only on a surface of the first $SiO_2$-containing insulating film by performing one or more times a process of adsorbing TMA only to the surface of the first $SiO_2$-containing insulating film and a process of forming an $SiO_2$ film only on the surface of the adsorbed TMA using the silanol group-containing silicon raw material and the oxidizing agent,
    wherein the process of selectively forming the second Ru film and the process of selectively forming the second $SiO_2$-containing insulating film are performed once or alternately performed multiple times.

6. The method of claim 4, further comprising:
before the process of burying the conductive film, forming a barrier film on the surface of the interlayer insulating film,
wherein the process of etching the conductive film includes removing the barrier film formed on portions other than the recess.

7. The method of claim 6, wherein the barrier film is selected from TiN, TaN, TiSiCN, TaSiCN, MnO, NiO, and HfO.

8. The method of claim 4, wherein the silanol group-containing silicon raw material is tris(tert-pentoxy)silanol (TPSOL) or tris(tert-butoxy)silanol (TBSOL).

* * * * *